(12) United States Patent
Mandell et al.

(10) Patent No.: US 7,006,961 B2
(45) Date of Patent: Feb. 28, 2006

(54) MARKER ARGUMENTATION FOR AN INTEGRATED CIRCUIT DESIGN TOOL AND FILE STRUCTURE

(75) Inventors: Michael I. Mandell, Los Angeles, CA (US); Arnold L. Berman, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 718 days.

(21) Appl. No.: 09/928,848

(22) Filed: Aug. 13, 2001

(65) Prior Publication Data

US 2003/0074644 A1    Apr. 17, 2003

(51) Int. Cl.
*G06F 17/50* (2006.01)
(52) U.S. Cl. .............. 703/15; 703/13; 703/14; 703/19; 716/7; 716/18
(58) Field of Classification Search ............... 703/14, 703/15; 716/7, 18
See application file for complete search history.

(56) References Cited

U.S. PATENT DOCUMENTS

| | | | |
|---|---|---|---|
| 5,222,030 A * | 6/1993 | Dangelo et al. | 703/15 |
| 5,526,277 A * | 6/1996 | Dangelo et al. | 716/3 |
| 5,541,849 A * | 7/1996 | Rostoker et al. | 716/19 |
| 5,544,066 A * | 8/1996 | Rostoker et al. | 716/18 |
| 5,544,067 A * | 8/1996 | Rostoker et al. | 703/14 |
| 5,557,531 A * | 9/1996 | Rostoker et al. | 716/1 |
| 5,572,437 A * | 11/1996 | Rostoker et al. | 703/13 |
| 5,655,107 A * | 8/1997 | Bull | 703/13 |
| 5,867,399 A * | 2/1999 | Rostoker et al. | 716/18 |
| 5,870,308 A * | 2/1999 | Dangelo et al. | 716/18 |
| 5,933,356 A * | 8/1999 | Rostoker et al. | 703/15 |
| 6,026,219 A * | 2/2000 | Miller et al. | 703/23 |
| 6,077,303 A | 6/2000 | Mandell et al. | 703/14 |
| 6,182,258 B1 * | 1/2001 | Hollander | 714/739 |
| 6,421,815 B1 * | 7/2002 | Seawright | 716/7 |
| 6,424,962 B1 * | 7/2002 | Billon | 706/61 |
| 6,470,482 B1 * | 10/2002 | Rostoker et al. | 716/6 |
| 6,477,698 B1 * | 11/2002 | Shalish | 716/18 |
| 6,513,143 B1 * | 1/2003 | Bloom et al. | 716/18 |
| 6,691,079 B1 * | 2/2004 | Lai et al. | 703/16 |
| 6,701,494 B1 * | 3/2004 | Giddens et al. | 703/14 |
| 6,745,160 B1 * | 6/2004 | Ashar et al. | 703/15 |
| 6,757,884 B1 * | 6/2004 | Mandell et al. | 716/18 |

(Continued)

OTHER PUBLICATIONS https://solvnet.synopsys.com; Synopsys Solvit Doc Id: 901665, Product: Behavioral Compiler, Topic: "use_netlist attribute with preserve function" Last Updated: Oct. 23, 1998.*

(Continued)

*Primary Examiner*—Jean R. Homere
*Assistant Examiner*—Akash Saxena
(74) *Attorney, Agent, or Firm*—Harness Dickey & Pierce P.L.C.

(57) ABSTRACT

A design tool and method characterizes a circuit at a hardware level description. A behavioral level description of the circuit is created. Symbolic equations for components of the behavioral level description are created. The behavioral level description is partitioned by inserting a marker component into the behavioral level description of the circuit to simplify subsequent processing used to prove equivalence between the behavioral and hardware level descriptions. The symbolic equations are back-substituted until output variables are expressed in terms of input variables that determine the output variables. The marker component is defined using a unique symbolic name. Current time counts of each clock cycle are used to compute an index for the marker component. The behavioral level description is transformed to produce symbolic and numeric files for compilation to gates and proof of functionality.

12 Claims, 8 Drawing Sheets

U.S. PATENT DOCUMENTS 6,782,511 B1 * 8/2004 Frank et al. .................. 716/9

OTHER PUBLICATIONS https://solvnet.synopsys.com; Synopsys Solvit Doc Id: 901157, Product: Behavioral Compiler, Topic: "Using Preserved Functions in Behavioral Compiler" Last Updated: Oct. 16, 2001.* https://solvnet.synopsys.com; Synopsys Solvit Doc Id: 002613, Product: (V)HDL Compiler, Topic: "Verilog and VHDL Directives" Last Updated: Oct. 8, 2002.* https://solvnet.synopsys.com; Synopsys Solvit Doc Id: 901336, Product: Design Compiler, Topic: "The partition_dp command does not work on a Mapped Design" Last Updated: Aug. 2, 2001.* https://solvnet.synopsys.com; Synopsys Solvit Doc Id: 901884, Product: Design Compiler, Topic: "Case Selector Bit Ranges Not Valid" Last Updated: Nov. 14, 2000.* https://solvnet.synopsys.com; Synopsys Solvit Doc Id: 903912, Product: Design Compiler, Topic: "Behavioral Compiler Information Roadmap" Last Updated: Oct. 23, 2001.*

"Computer-Aided Partitioning of Behavioral Hardware", McFarland, M.C., S.J. This paper appears in: IEEE, Design Automation Conference Proceedings 1983, 20th, pp. 472-478□□.*

"Assignment Decision Diagram and its Uses in High-level Synthesis", V. Chaiyakul and D.D. Gajski, Technical Report 190 9~-103, University of California Irvine, Oct. 1992.*

"Heirarchial Model Partitioning for Parallel VLSI-Simulation Using Evolutionary Algorithms Improved By Superpositions of Partitions" by Haupt R. et al; Proc. 5th European Conr. on Intell. Techn. and Soft Comp. (EUFIT'97), p. 804-808, 1997.*

"Computer-Aided Partitioning of Behavioral Hardware", McFarland, M.C., S.J. This paper appears in: IEEE, Design Automation Conference Proceedings 1983, 20th, pp. 472-478.*

"Assignment Decision Diagram and its Uses in High-level Synthesis", V. Chaiyakul and D.D. Gajski, Technical Report #9~-103, University of California Irvine, Oct. 1992.*

* cited by examiner

| Component | Value Of String At Component Output | Printed To Equation File |
|---|---|---|
| Input 12 | x[1] | |
| Delay 14 | s[14,0,1] | s[14,0,1]:=x[0] |
| Multiplier 16 | s[16,0,1] | s[16,0,1]:=x[1]*h[0] |
| Multiplier 18 | s[18,0,1] | s[18,0,1]:=s[14,0,1]*h[1] |
| Adder 26 | s[26,0,1] | s[26,0,1]:=s[16,0,1]+s[18,0,1] |
| Output 28 | z[1] | z[1]:=s[26,0,1] |

Prints To Equation File: mark y[n] – x[n]

| Component | Value Of String At Component Output | Printed To Equation File |
|---|---|---|
| Input 12 | x[1] | |
| Delay 14 | s[2,0,1] | s[2,0,1]:=x[0] |
| Multiplier 16 | s[3,0,1] | s[3,0,1]:=x[1]*h[0] |
| Multiplier 18 | s[4,0,1] | s[4,0,1]:=s[2,0,1]*h[1] |
| Marker 60 | y[1] | mark y[1]:=s[3,0,1] |
| Adder 26 | s[7,0,1] | s[7,0,1]:=y[n] + s[4,0,1] |
| Output 28 | z[1] | z[1]:=s[7,0,1] |

*FIG. 18.*

MARKER ARGUMENTATION FOR AN INTEGRATED CIRCUIT DESIGN TOOL AND FILE STRUCTURE

TECHNICAL FIELD

The present invention relates to electronic circuit fabrication, and more particularly to a computer-based method and architecture that automatically transforms a behavioral description of a circuit into a hardware description of the circuit and inserts markers to simplify the subsequent processing used to prove equivalence of the behavioral and hardware descriptions.

BACKGROUND OF THE INVENTION

In order to fabricate an electronic circuit such as an application specific integrated circuit (ASIC) or a field programmable gate array (FPGA), a number of processes must be performed. For example, the first step is to design the circuit at a "behavioral" level. The behavioral description is the top level of the design hierarchy. A hardware description characterizes the circuit using actual hardware components and is the lowest level of the design hierarchy.

The behavioral description is typically a block diagram or netlist that describes the various functions of the circuit in relatively general terms. The hardware description is based on the behavioral description. The behavioral description does not have enough specificity to fully enable a circuit manufacturer to implement the circuit design. The conventional approach is to manually generate an electronic file that characterizes the circuit at the hardware level in a programming language such as hardware description language (HDL). A design engineer goes through the behavioral description on a component-by-component basis and generates the necessary code sets in the programming language. This approach is labor intensive and subject to human error.

Once the electronic file has been manually generated, a complex verification process is required. In the case of the ASIC design, the functionality is extensively verified from a model of the circuit written in C-code. A select set of C-code input simulation vectors (i.e. input sequences) are then also applied to the HDL circuit model. In this co-simulation, the output vectors from the HDL model are compared bit by bit to the corresponding output vectors from the C-code model to establish a correspondence between the performance verified by the C-code model and the hardware actually being fabricated. This is typically required due to the complexity of the ASIC chip and the difficulty in performing a functional simulation in HDL, the complexity and cost of the ASIC fabrication process, and the need for a high level of certainty as to the functionality and first pass success of the electronic file and its subsequent fabrication. The manual generation of the C model also requires detailed knowledge of the C programming language, which increases the labor costs that are associated with fabrication. Once the electronic file has been verified, it is typically converted to the format used by the manufacturer using a conversion program such as Synopsis. After the electronic file has been converted, the manufacturer fabricates the circuit.

In U.S. Pat. No. 6,077,303 to Mandell et al. and co-pending application "Application Specific Integrated Circuit Design Tool and File Structure" Ser. No. 09/918,596, filed Jul. 31, 2001, and assigned to The Boeing Company, a design tool and method for simplifying the design of ASICs is disclosed. The design tool and method generates symbolic and numeric equations. In situations involving relatively less complex, small to medium ASICs, the symbolic equations that are generated by the design tool are finite and computationally feasible. In other words, the symbolic equations require a limited amount of computer storage and running time to be further simplified. However, when more complex circuits are involved (such as large ASICs and/or circuits including cascaded finite impulse response (FIR) filters, closed-loops, and other complex components), the resulting set of symbolic equations become large enough to overflow the memory that is available to the workstation and/or the capability of the symbolic manipulation tool that is used to compare the equations.

SUMMARY OF THE INVENTION

A design tool and method according to the invention characterizes a circuit at a hardware level description. A behavioral level description of the circuit is created. Symbolic equations for components of the behavioral level description are created. The behavioral level description is partitioned by inserting a marker component between first and second components of the circuit to simplify the subsequent processing used to prove the equivalence of the behavioral and hardware level descriptions.

In other features of the invention, the symbolic equations are back-substituted until output variables are expressed in terms of input variables that determine the output variables. The marker component is defined using a unique symbolic name. Current time counts of each clock cycle are used to compute an index for the marker component.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

BRIEF DESCRIPTION OF THE DRAWINGS

The present invention will become more fully understood from the detailed description and the accompanying drawings, wherein:

FIGS. 19 and 20 illustrate an output variable naming convention; and

FIG. 21 illustrates a generalized rate change component.

DETAILED DESCRIPTION OF THE PREFERRED EMBODIMENTS

The following description of the preferred embodiment(s) is merely exemplary in nature and is in no way intended to limit the invention, its application, or uses.

Figure 1:
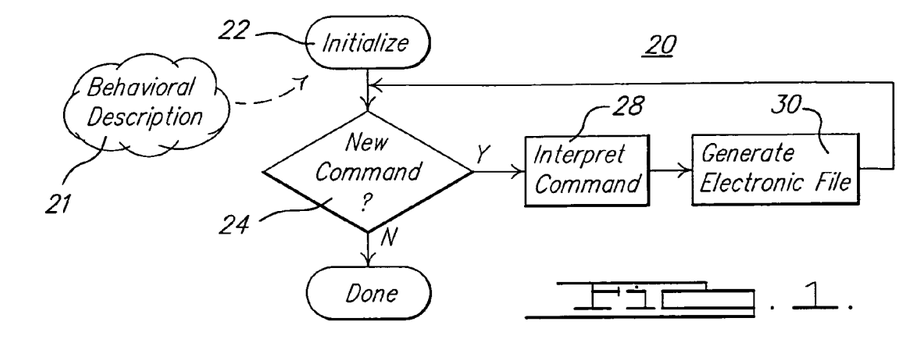
FIG. 1 is a flowchart of a computer-implemented method for characterizing a circuit at a hardware level.

Turning now to FIG. 1, a computer-implemented design tool and method for characterizing a circuit (not shown) at a hardware level is shown. The circuit is preferably an application specific integrated circuit (ASIC), but other types of circuits such as field programmable gate arrays (FPGA) can also benefit from the present invention. Furthermore, the particular application for the circuit not critical.

Generally, the method 20 includes an initialization step 22 for receiving a circuit description 21 that characterizes the circuit at a behavioral level of a design hierarchy. The description is preferably in the form of a block diagram, a descriptive netlist or other suitable format. A netlist is a list of names of symbols or circuit elements and their interconnections. Netlists can be captured from a schematic of a computer aided engineering (CAE) application.

Upon receiving a new computer-based command at step 24 (from a source such as a keyboard or a script driver input), the new command is interpreted at step 28. The new command requests a desired modification in the description of the circuit. For example, the modification may replace a digital filter with a delay chain and multipliers. At step 30, an electronic file is generated based on the new command such that the electronic file characterizes the circuit at the hardware level in a desired programming language. The method 20 is an iterative method in which the electronic file is "built-up" as commands are received. The hardware level is located at a lower level in the hierarchy (typically at the bottom level) than the behavioral level.

Although the desired programming language is preferably the hardware description language (HDL), it can be appreciated that the present invention is not so limited. In the case of an ASIC, a verification mechanism is preferably provided in the form of a C language file. Simulating the operation of the circuit with the C language file provides a mechanism for cross-checking the HDL file. It is important to note, however, that the present invention provides confirmation algorithms that (depending on the confidence requirements of the application) might obviate the need for the C language file.

Figure 2:
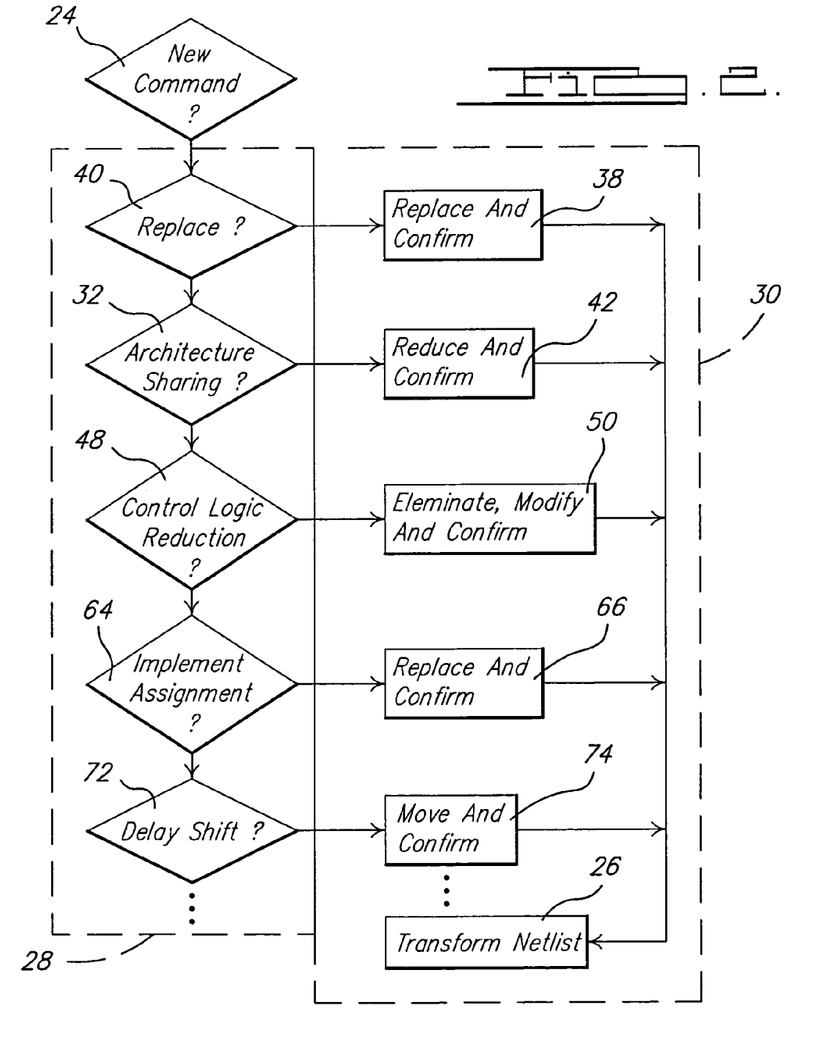
FIG. 2 illustrates a method for implementing modifications with a set of predefined modules.

Turning now to FIG. 2, the presently preferred approach to the step 28 of interpreting the new command may include one or more steps. For example, when a replacement command is received at step 40, an original component (e.g., digital filter) of the circuit residing at an original level in the hierarchy is replaced at step 38 with one or more replacement components (e.g., delay chain and multipliers) residing at a lower level in the hierarchy. Step 38 also confirms that the replacement components are functionally equivalent to the original component. Detailed confirmation algorithms is discussed in greater detail below. At step 26, the hierarchical netlist is transformed (or updated) in accordance with the modifications.

An important aspect of ASIC design is the concept of architecture sharing. Architecture sharing involves the sharing of physical processing paths by symbolic (logical) processing in order to conserve resources. For example, a block diagram of a circuit at a behavioral level includes ten multipliers operating at 1 MHz. Architecture sharing permits the substitution of one multiplier operating at 10 MHz. When the architecture sharing command has been entered in step 32, an original architecture of the circuit is reduced at step 42 to provide a reduced architecture Furthermore, step 42 also confirms that the reduced architecture is functionally equivalent to the original architecture.

Figure 3A:
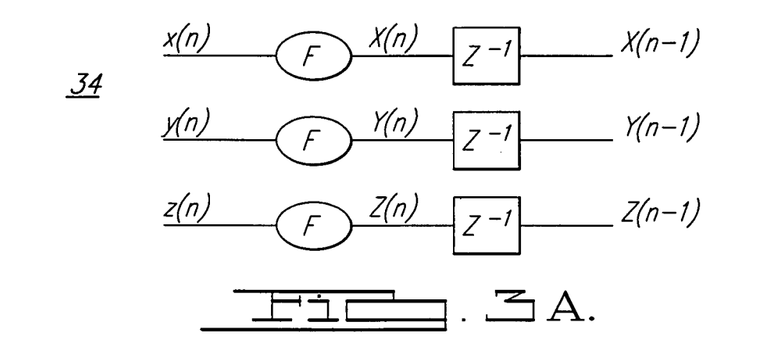
FIG. 3A is a block diagram of an original architecture of a circuit before application of an architecture sharing command.
Figure 3B:
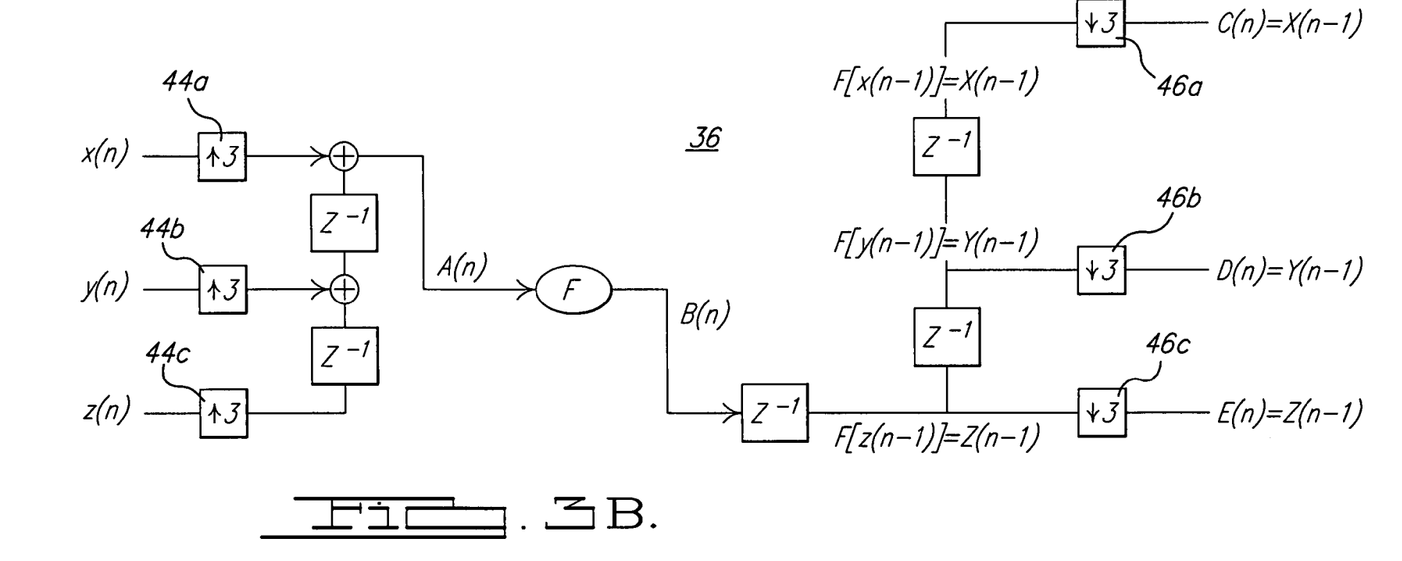
FIG. 3B is a block diagram of a reduced architecture resulting after application of the architecture sharing command.

The process of confirming that the reduced architecture is functionally equivalent to the original architecture will now be described in greater detail. With continuing reference to FIGS. 3A and 3B, the original architecture 34 is described for an arbitrary n as follows:

$$X(n)=F[x(n)]; X(n-1)=F[x(n-1)]$$

$$Y(n)=F[y(n)]; Y(n-1)=F[y(n-1)]$$

$$Z(n)=F[z(n)]; Z(n-1)=F[z(n-1)]$$

If the reduced architecture 36 is defined as $$A(n) = \begin{cases} X\left(\frac{n}{3}\right) & \text{When } n \bmod 3 = 0 \\ Y\left(\frac{n-1}{3}\right) & \text{When } n \bmod 3 = 1 \\ Z\left(\frac{n-2}{3}\right) & \text{When } n \bmod 3 = 2 \end{cases}$$

Then $$C(n)=F[A(3n-3)]=X(n-1)$$

$$D(n)=F[A(3n-2)]=Y(n-1)$$

$$E(n)=F[A(3n-1)]=Z(n-1)$$

Thus, the original architecture 34 is equivalent to the reduced architecture 36. Specifically, it can be seen that interpolators 44 (or up converters) and decimators 46 (or down converters) permit the use of an instantaneous function F to be reduced by a factor of 3.

Returning now to FIG. 2, the present invention also provides for control logic reduction. This feature is particularly important in cases where architecture sharing results in an increase in control logic. When it is determined that a control logic reduction command has been received at step 48, redundant control logic of the circuit is eliminated and necessary control logic is modified at step 50 to produce a reduced architecture.

Figure 4:
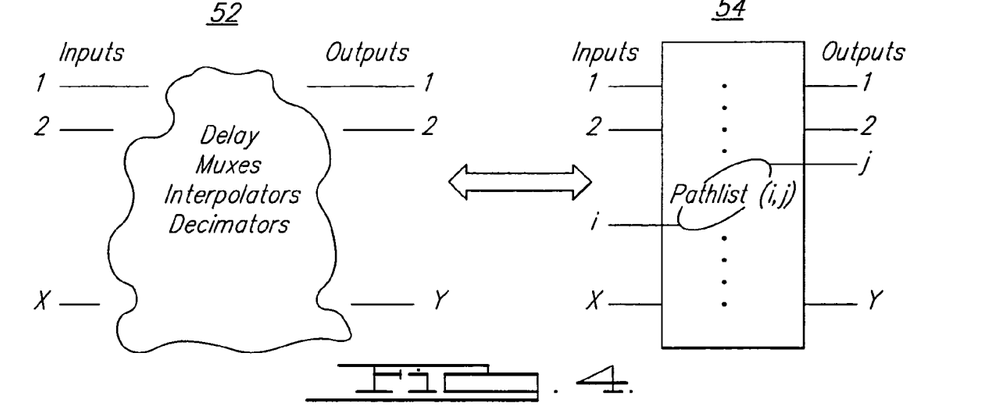
FIG. 4 is a block diagram illustrating the reduction of control logic.
Figure 5A:
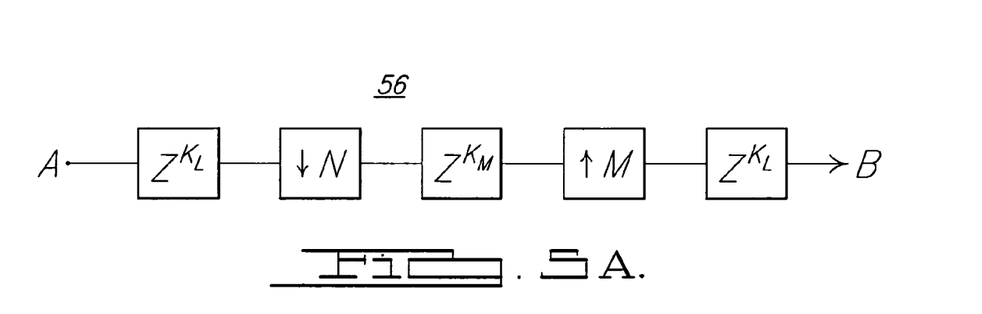
FIG. 5A is a block diagram of a single path in accordance with the principles of the present invention.
Figure 5B:
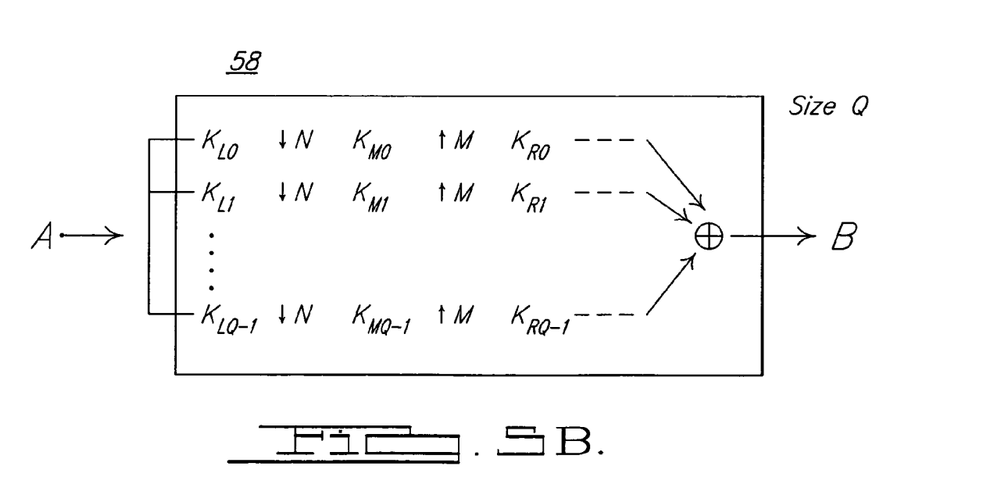
FIG. 5B is a block diagram of a set of parallel paths in accordance with principles of the present invention.

FIG. 4 illustrates the transformation of a group of logic circuits 52 into a rate change component (or reduced logic architecture) 54. It will be appreciated that the logic circuits 52 contain various rate change components such as delays, multiplexers, interpolators and decimators. It will further be appreciated that the logic circuits 52 can be defined as a set of path lists that interconnect a set of inputs to a set of outputs. FIGS. 5A and 5B demonstrate a single path 56 and a set of paths 58, respectively. The single path 56 between points A and B is therefore characterized by, corresponding to the single path 56 of FIG. 5A.

A path list is therefore made up of a set of paths 58 from point A to point B such that each path has the same ↓N and ↑M. It will be appreciated that in order to ensure that two outputs do not arrive concurrently, the set of paths 58 is constrained by (Kri−KRj)MOD M≠0 for any i≠j. A rate change component 54 is defined as a set of path lists that interconnect the set of inputs as shown in FIG. 4.

The various multi-rate components can therefore be represented as interpolation

Figure 6:
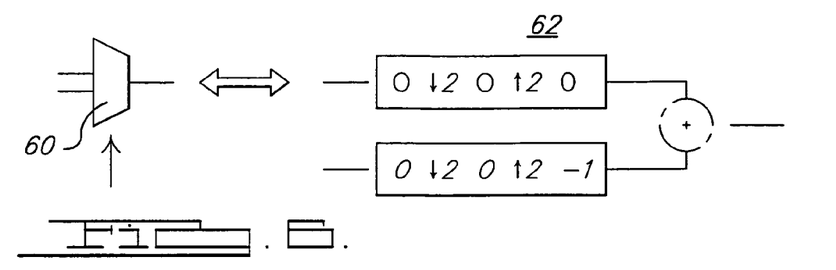
FIG. 6 is a block diagram showing a two-way multiplex control counter.

Furthermore, FIG. 6 illustrates that a 2-way counter-controlled mux 60 can be given by the counter representation 62. In order to resolve two paths in series we have Specifically, the algorithm is given by Algorithm:
(1) L $\hat{=}$ GCD (M$_1$, N$_2$)
(2) If (K$_{R1}$+K$_{L2}$) MOD L≠0
   Delete path
   Go to "DONE"

$$\overline{M}_1 = \frac{M_1}{L}; \overline{N}_2 = \frac{N_2}{L}; \qquad (3)$$

(4) Use Euclid's algorithm to find P$_1$, P$_2$, such that $P_1\overline{M}_1+P_2\overline{N}_2=1$ (5) Define the equivalent values for the new path $$K_{Leq} = K_{L1} + N_1 K_{M1} + \frac{K_{R1} + K_{L2}}{L} P_1 N_1$$

$$K_{Req} = K_{R2} + M_2 K_{M2} + \frac{K_{R1} + K_{L2}}{L} P_2 M_2$$

$K_{Meq}=0$ $N_{eq}=N_1\overline{N}_2$ $M_{eq}=\overline{M}_1M_2$ (6) "DONE"

Figure 7A:
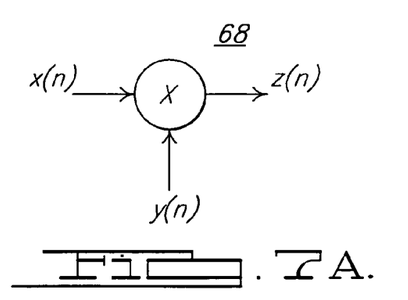
FIG. 7A is a block diagram of an original component before application of an implementation assignment command.
Figure 7B:
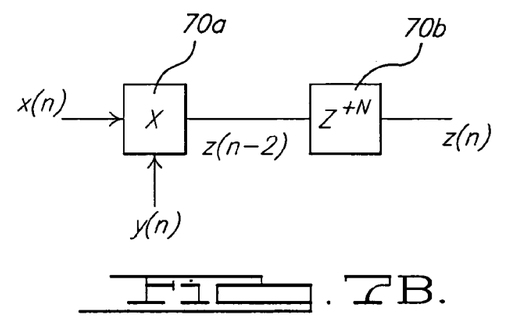
FIG. 7B is a block diagram illustrating implementation components after application of an implementation assignment command.

Returning now to FIG. 2, the present invention further determines whether an implementation assignment command has been received at step 64. Step 66 replaces an original component of the circuit with one or more implementation components based on the implementation assignment command. Specifically, FIGS. 7A and 7B illustrate that an original component 68 (although not necessarily a component of the behavioral description) has one or more implementation components 70 that are equivalent to the original component 68. The implementation components 70 are contained within the library of foundry primitives and have unambiguous HDL descriptions that are associated with them. Typically, the implementation components are adders and multipliers. For example, if implementation component 70a is a multiplier that multiplies two 5-bit numbers and produces a 10-bit result, this component can be readily represented in HDL.

Figure 8:
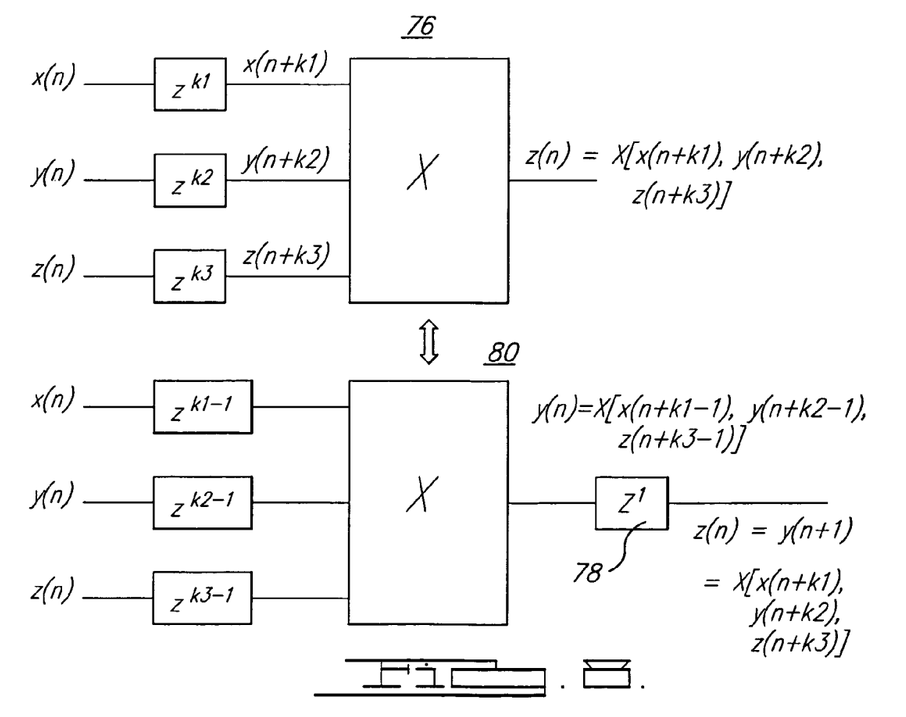
FIG. 8 is a block diagram illustrating delay shifting.

Returning now to FIG. 2, the present invention determines whether a delay shifting command has been received at step 72. Step 74 moves a delay component from a first location in the circuit to a second location in the circuit based on the delay shifting command. Specifically, FIG. 8 illustrates the rearrangement of an original architecture 76 by moving a delay component 78 from a first location in the circuit to a second location. The resulting architecture 80 has a total delay that is maintained.

The hierarchical netlist has a unique file structure that is represented in several equivalent forms throughout the transformation process. An element in the netlist is represented by a N-tuple, defining:

TABLE 1

| Tuple # | Parameter |
| --- | --- |
| 1 | element type |
| 2 | input ports |
| 3 | - from |
| 4 | output ports |
| 5 | - to |
| 6 | level in hierarchy |
| N | context dependent flags |

The design tool architecture therefore accepts inputs at the behavioral level and automatically generates both compilable code at the HDL level and C-code for efficient system simulation. When the tool architecture is script driven, automatic transformation of the behavioral description (either block diagram or netlist) into a structural HDL form is possible. In the structural HDL form, realizable foundry library components (such as adders and multipliers) are substituted for idealized components and architecture sharing and bit precision are defined. The automated code generation and associated file structure produced by the design tool architecture allow the design time from system concept to delivery of compiled code for the resulting ASIC to be reduced by as much as a factor of 10.

The file structure allows for efficient 2-way travel through the hierarchical netlist when executing the transformations. Furthermore, the tool architecture allows for a systematic hierarchical proof of equivalence at every transformation, rather than requiring a much more complex (and often impossible) proof of overall equivalence at the completion of compilation. The command sets (i.e., transformations) are preferably script driven and are intended to be reusable to efficiently optimize a given problem architecture as well as to solve similar functional problems.

The design tool and method according to the present invention also inserts markers into a behavioral block diagram and associated netlist to confirm that when the netlist is processed or parsed into a set of symbolic equations, the resulting symbolic equations are finite and computationally feasible. The marker augmentation disclosed herein is compatible with the existing design tool methodology that is disclosed in U.S. Pat. No. 6,077,303, which is incorporated by reference. More specifically, the marker augmentation is compatible with theorems relating to the manipulation of delays and generalized rate change components. The design tool, according to the invention, generates symbolic equations with markers that are provably equivalent to the HDL code that defines the ASIC design. The symbolic equations with markers are then compared to reference or textbook equations to prove that the VHDL design is functionally equivalent to the original high-level behavioral block diagram. As part of the proof, the symbolic equations with markers are simplified in a symbolic manipulation program where each of the output variables is eventually traced back to the set of input values that determine it.

Figure 9:
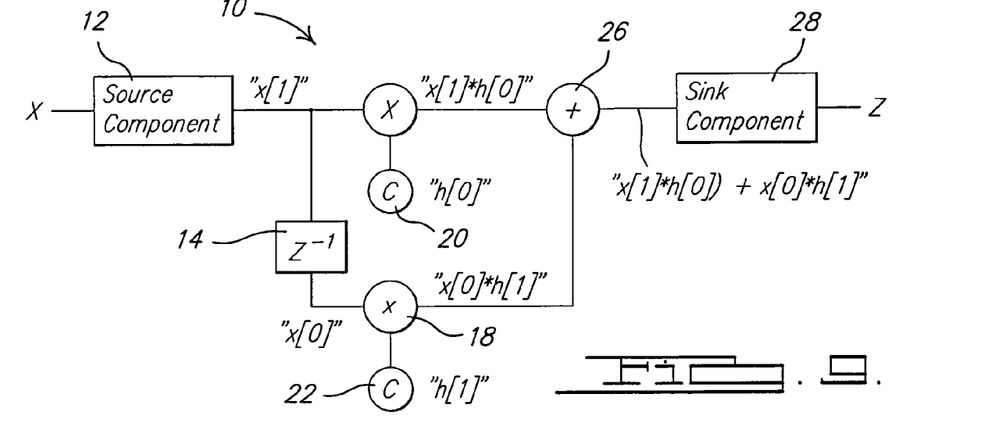
FIG. 9 is a block diagram of an exemplary circuit topology.

Referring now to FIG. 9, an exemplary circuit topology 10 is illustrated. The exemplary circuit topology 10 has a source component 12 that has a symbolic string output "x[1]". An output of the source component 12 is input to a unit delay component 14 that provides a unit delay ($z^{-1}$) and has an symbolic string output "x[0]". An output of the source component 12 is also input to an ideal multiplier component 16. An output of the unit delay component 14 is input to an ideal multiplier component 18. A constant component 20 has a symbolic string output "h[0]" that is equal to a constant number. A constant component 22 has a symbolic string output "h[1]" that is equal to a constant number. A symbolic string output of the ideal multiplier component 16 is equal to "x[1]*h[0]". A symbolic string output of the ideal multiplier component 18 is equal to "x[0]*h[1]". The outputs of the ideal multipliers 16 and 18 are input to an ideal adder component 26. A symbolic string output of the ideal adder component 26 is equal to "x[1]*h[0]+x[0]*h[1]". The circuit topology 10 has a sink component 28 that is associated with a symbolic string "Z". A symbolic equation that is equal to "z:=x[1]*h[0]+x[0]*h[0]+x[0]*h[1]" is printed to a symbolic equation file.

Figure 10:
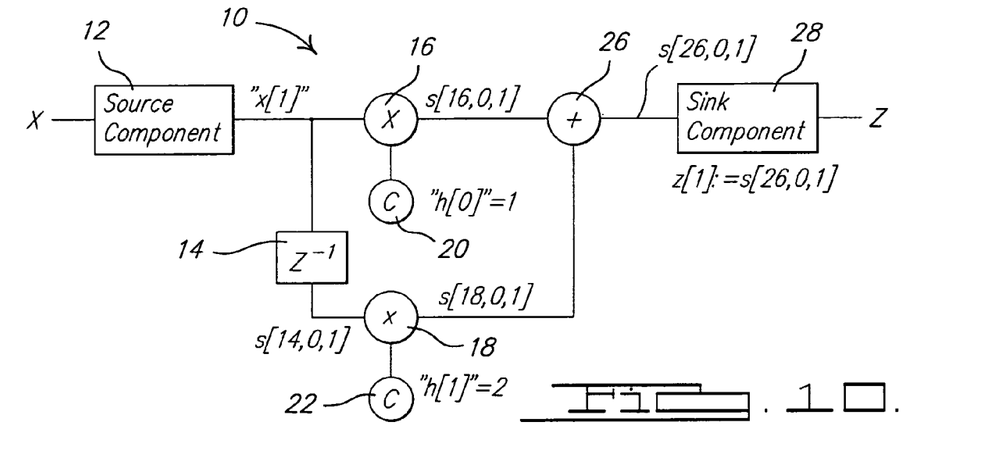
FIG. 10 is a block diagram illustrating the exemplary circuit topology of FIG. 9 at time t=1.
Figure 11:
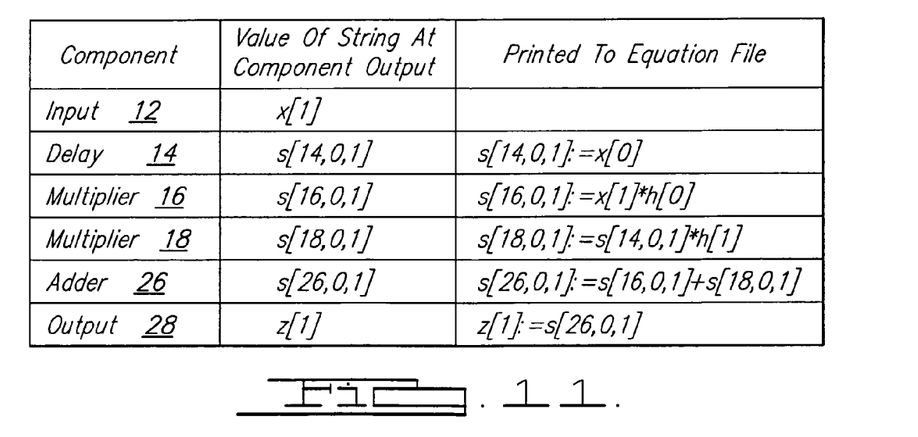
FIG. 11 is a table illustrating string values and outputs printed to an equation file.

Referring now to FIGS. 10 and 11, the design tool is modified according to the invention to print the set of equations at each node of the block diagram on each clock cycle. For example, FIG. 10 illustrates time t=1. In FIG. 10, reference numbers from FIG. 9 will be used to denote similar elements. The modifications resulted in a large number of relatively short equations being written into the equation file for subsequent comparison to the reference equations. In the circuit topology 10, the short length of the individual equations present at any clock cycle considerably eases the computational and storage burden on the HDL simulation program that is used to generate these equations from the symbolic HDL code. The HDL simulation program can be a ModelTech HDL simulator or any other suitable simulation program. As was true with FIG. 9, the symbolic manipulation program back-substitutes from one equation to the next until the output variables are expressed in terms of the set of input values that determined them.

The source component 12 of the circuit topology 10' has a string output of "x[1]". The output of the source component 12 is input to the unit delay component 14 that has a string output s[14,0,1] where the string output is defined as s[ID #, pin #, time]. The string output of each component must be a unique variable. The constant component 20 has a string output h[0]=1. The constant component 22 has a string output h[1]=2. String output of the ideal multiplier component 16 is equal to s[16,0,1]. A string output of the ideal multiplier component 18 is equal to s[18,0,1]. A string output of the ideal adder component 26 is equal to s[26,0,1]=s[16,0,1]+s[18,0,1]. The string output z[1]:=s[26,0,1] is printed to a file for time t=1.

Figures 11, 12:
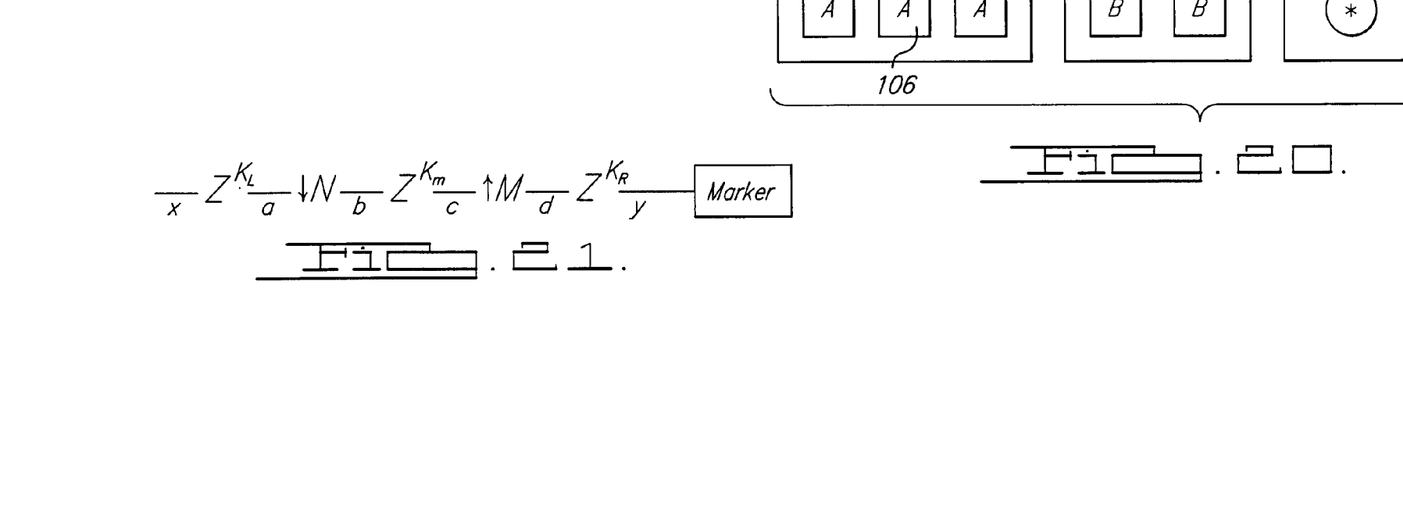
FIG. 12 illustrates an exemplary circuit topology with equations that grow quickly and are likely to cause processing overload.
Figure 12:
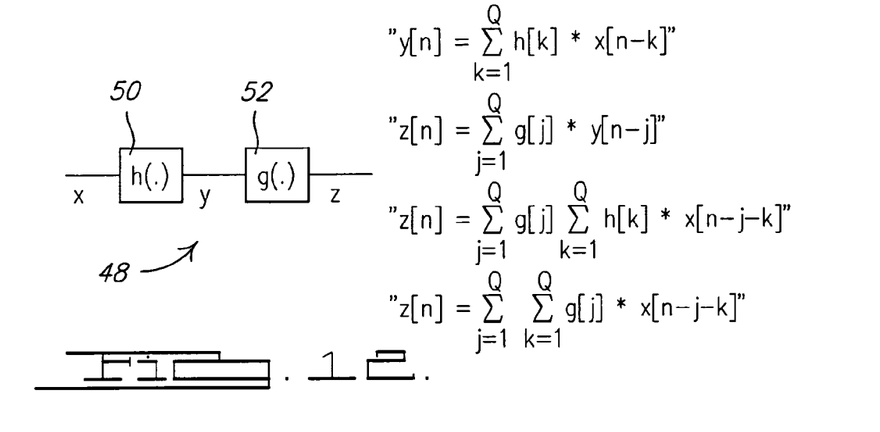

In some cases, however, such as a cascade of filter functions or the expression of closed loops, the resulting number of terms and equations grows quickly due to the nature of the circuit topology. For example, FIG. 12 illustrates an equation that grows explosively and fails to keep the resulting set of equations computationally reasonable. FIG. 12 includes a circuit topology 48 with a first component 50 having an input x and an output y and a second component 52 having an input y and an output z. The resulting set of equations for the circuit topology 48 grows quickly and is computationally difficult.

Figure 13:
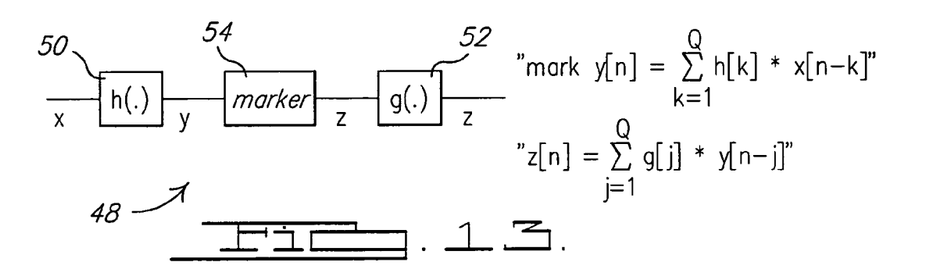
FIG. 13 illustrates a circuit topology with marker components.

Referring now to FIG. 13, in order to keep the resulting set of equations computationally feasible, the design tool allows the designer to partition the circuit topology 48 with one or more marker components 54. Despite the insertion of the marker component 54, the design tool automatically transforms the netlist to produce both numeric and symbolic files for subsequent compilation to gates and proof of functionality. As a result of the insertion of the marker component 54 into the circuit topology 48 that describes a cascade of filters, the equation with $n^2$-order terms is transformed into two equations each having n-order terms and the computational requirements are reduced.

Figure 14:
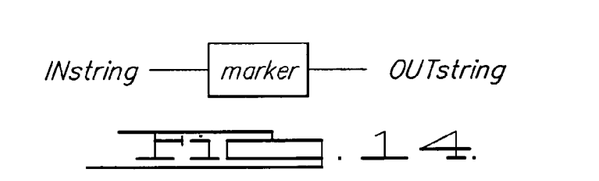
FIG. 14 illustrates high level functional requirements of the marker component.
Figure 16:
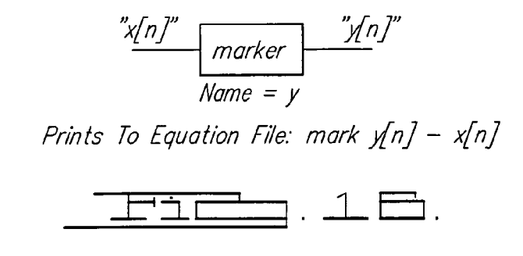
FIG. 16 illustrates additional high level functional requirements for the marker component.

Referring now to FIGS. 14 and 16, the high-level functional requirements of the marker component are summarized. The marker component is defined using a symbolic name. During HDL simulation, the marker component uses current time counts of each clock cycle to compute an index. The marker component computes a symbolic string for the output node in the HDL simulation. The form of the symbolic string is marker_name[index]. Preferably, the marker_name is a unique prefix. For example, if the marker_name is equal to y, the input string is equal to x[n], and the output string is equal to y[n], the symbolic equation "mark y[n]=x[n]".

Figure 15:
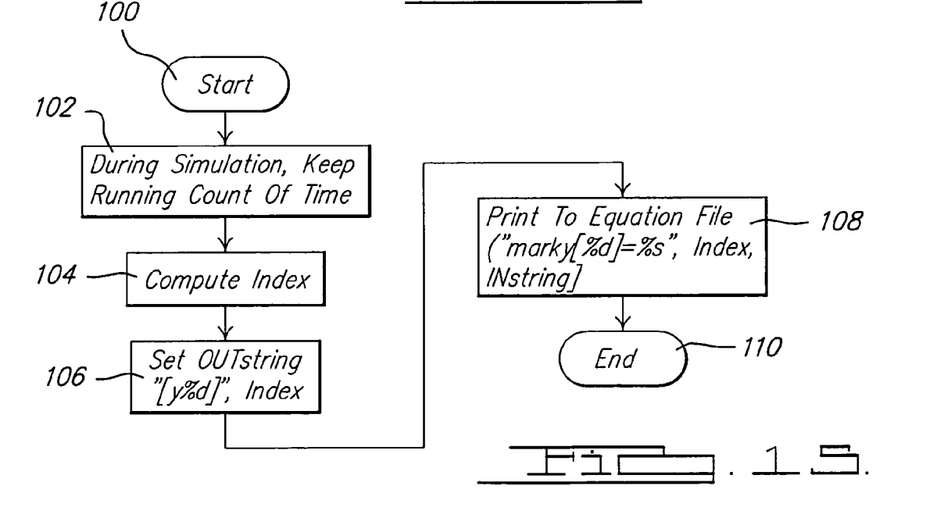
FIG. 15 illustrates steps for inserting the marker component.

Referring now to FIG. 15, steps for handling a marker component are illustrated. Control begins at step 100. In step 102, control keeps a running count of time during the simulation. In step 104, the index is computed. In step 106, the output string is set equal to "y[%d]", index". In step 108, control prints ["mark y[%d=%s", index, INstring] to the equation file. Control ends at step 110.

Figure 17:
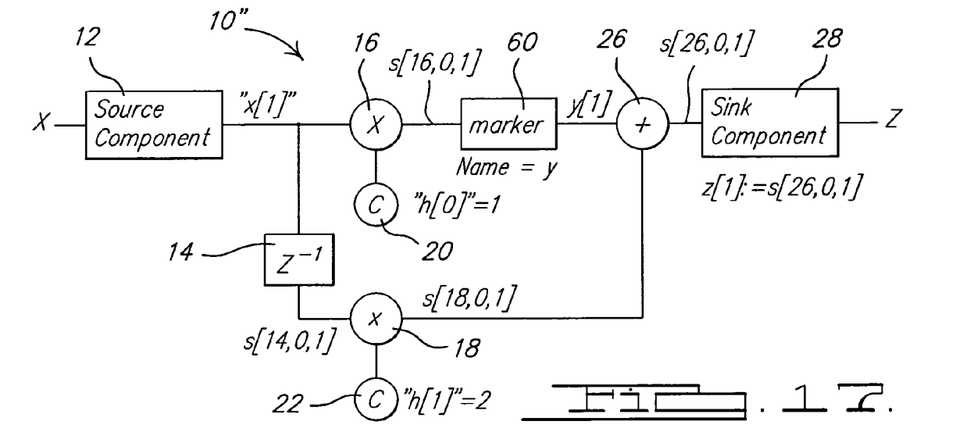
FIG. 17 illustrates a marker component inserted in the exemplary circuit topology of FIG. 9.
Figure 18:
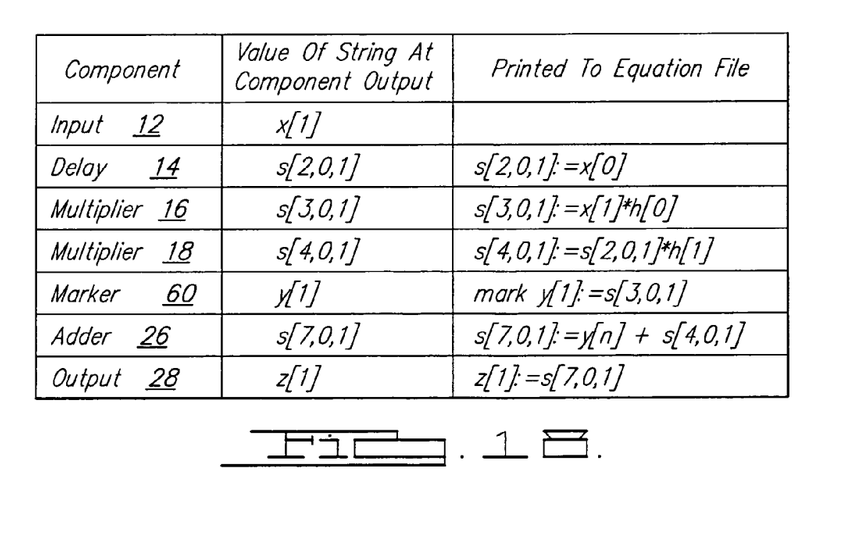
FIG. 18 is a table illustrating string values and outputs printed to an equation file for the circuit topology of FIG. 17.

Referring now to FIGS. 17 and 18, a marker component 60 is inserted into the example illustrated in FIG. 10. Reference numbers from FIG. 10 will be used where appropriate to identify similar components. The circuit topology 10'' has a source component 12 that has a symbolic string output "x[1]". The output of the source component 12 is input to the unit delay component 14 that has a modified symbolic string output s[14,0,1]. The constant component 20 has a modified symbolic string output h[0]=1. The constant component 22 has a modified symbolic string output h[1]=2. A modified symbolic string output of the ideal multiplier component 16 is equal to s[16,0,1] and is input to the marker component 60. An output of the marker component 60 is input to the ideal adder component. A modified symbolic string output of the ideal multiplier component 18 is equal to s[18,0,1]. An output of the marker component 60 "mark y[1]:=s[16,0,1] is input to the ideal adder component. A modified symbolic string output of the ideal adder component 26 is equal to s[26,0,1]=y[n]+s[18,0,1]. The block diagram 10 has the sink component 28 "z[1]". The modified symbolic equation equal to z[1]:=s[26,0,1] is printed to a modified symbolic equation file for time t=1.

As was previously discussed, the output of each component must have a unique variable name. FIG. 19 illustrates a hierarchy with an exemplary component output variable naming convention. The hierarchy includes a top entity 100 with three instantiations of entity A (104, 106, and 108) into the top entity 100, two instantiations of entity B (110 and 112) into the entity A 104, and the instantiation of a multiplier 114 into the entity B 110. Two instantiations of entity B (118 and 120), are created in the entity A 106. Two instantiations of entity B (122 and 124) are created in the entity B 108.

One suitable naming convention to define unique variable names where s[hierarchy path list, pin #, count] is either a time stamp or an event stamp. A trace of a hierarchy path defines a unique ID. For example, the entity A 104 has a unique component ID s[104,O,n] and the entity B 110 has a unique component ID s[104,110,09,n]. The multiplier has a unique component ID s[104,110,114,0,n]. Skilled artisans can appreciate that other suitable naming conventions can be employed. For example, the unique component ID can be s[104.110.114, 0,n], s[104-110-114,O,n], etc. FIG. 20 illustrates internal stored representations of the hierarchy of FIG. 19.

Referring now to FIG. 21 and the derivation below, a detailed description of the marker index is defined in terms of a generalized rate change component. The resulting index is required to make the partitioned equations recognizable, even after netlist transformations and element sharing. The index derivation is fully generalized:

$$a[n]=x[n+K_L]$$

$$b[n]=a[Nn]$$

$$c[n]=b[n+K_M]$$

$$d[n] = \{c[n/M]nmcdM = 0$$
$$\quad\quad 0 \quad \text{else}$$

$$y[n]=d[n+K_R]$$

Substitute back for y[n]

$$y[n] = \left\{ c\left[\frac{n+K_R}{M}\right] (n+K_R) \operatorname{Mod} M = 0 \right.$$
$$\quad\quad 0 \quad \text{else}$$

$$c\left[\frac{n+K_R}{M}\right] = b\left[\frac{n+K_R}{M} + K_m\right]$$
$$= a\left[\left(\frac{n+K_R}{M} + K_M\right)N\right]$$
$$= x\left[\left(\frac{n+K_R}{M} + K_M\right)N + K_L\right]$$

Thus, $$y[n] = \left\{ x\left[\left(\frac{n+K_R}{M} + K_m\right)N + K_L\right](n+K_R)\operatorname{Mod} = c \right.$$
$$\quad\quad 0 \quad \text{else}$$

At time $= \left(\left(\frac{n+K_R}{M}\right) + K_M\right)N + K_L$ set index $+ n$ Thus $t = \left(\frac{i+K_R}{M} + K_M\right)N + K_L$ write index (i) as fn of time (t)

$$i = (t - K_L)\frac{M}{N} - (K_M + K_R)(t - K_L)\operatorname{Mod} N = 0$$

Those skilled in the art can now appreciate from the foregoing description that the broad teachings of the present invention can be implemented in a variety of forms. Therefore, while this invention can be described in connection with particular examples thereof, the true scope of the invention should not be so limited since other modifications will become apparent to the skilled practitioner upon a study of the drawings, specification and following claims.

What is claimed is:

1. A computer implemented design method for characterizing a circuit at a hardware level description, comprising:
   creating a behavioral level description using a descriptive netlist of said circuit;
   generating symbolic equations for components of said behavioral level description using a computer;
   partitioning said behavioral level description using a computer by inserting a marker component into said behavioral level description of said circuit to simplify subsequent processing used to provide equivalence between said behavioral and hardware level descriptions; and using current time counts of each clock cycle to compute an index for said marker component.

2. The method of claim 1 further comprising back-substituting in said symbolic equations until output variables are expressed in terms of input variables that determine said output variables.

3. The method of claim 1 further comprising transforming said behavioral level description to produce symbolic and numeric files for compilation to gates and proof of functionality.

4. The method of claim 1 further comprising defining said marker component using a unique symbolic name.

5. A method for characterizing a circuit at a hardware level description, using a processor, comprising:

creating a behavioral level description of said circuit;

generating symbolic equations for components of said behavioral level description usina the processor;

partitioning said behavioral level description using the processor by inserting a marker component into said behavioral level description to simplify subsequent processing used to prove equivalence of said behavioral and hardware level descriptions;

defining said marker component using a unique symbolic name;

maintaining a running count of time during a circuit simulation;

forming said behavioral level description to include a descriptive netlist; and computing an index for said marker component using the running count of time.

6. The method of claim 5 further comprising:
generating an output string; and
printing said output string to an equation file.

7. A method for characterizing a circuit at a hardware level description, using a processor, comprising:

creating a behavioral level description of a circuit including a plurality of components;

partitioning said behavioral level description, using the processor, by inserting a marker component into said behavioral level description to simplify subsequent processing used to prove equivalence between said behavioral and hardware level descriptions and to create a modified behavioral level description;

constructing symbolic hardware description language code from said modified behavioral level description using the processor;

forming a running count of time during a circuit simulation;

forming said behavioral level description to include a descriptive netlist; and computing an index for said marker component using the running count of time.

8. The method of claim 7 further comprising constructing symbolic C code from said modified behavioral level description.

9. The method of claim 8 further comprising confirming that said C code is functionally equivalent to said hardware description language code.

10. The method of claim 9 further comprising constructing numeric C code from said modified behavioral level description.

11. The method of claim 10 further comprising confirming that said numeric C code is functionally equivalent to said symbolic C code.

12. The method of claim 11 further comprising confirming that said numeric C code is functionally equivalent to said symbolic hardware description language code.

* * * * *